(12) United States Patent
Anderson et al.

(10) Patent No.: US 7,937,675 B2
(45) Date of Patent: May 3, 2011

(54) STRUCTURE INCLUDING TRANSISTOR HAVING GATE AND BODY IN DIRECT SELF-ALIGNED CONTACT

(75) Inventors: Brent A. Anderson, Jericho, VT (US); Andres Bryant, Burlington, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 11/935,612

(22) Filed: Nov. 6, 2007

(65) Prior Publication Data

US 2009/0119626 A1 May 7, 2009

(51) Int. Cl.
*G06F 17/50* (2006.01)
*H01L 29/76* (2006.01)

(52) U.S. Cl. .......................................... 716/55; 257/213
(58) Field of Classification Search .................... 716/11, 716/55; 257/213
See application file for complete search history.

(56) References Cited

U.S. PATENT DOCUMENTS

| | | | |
|---|---|---|---|
| 5,405,795 A | 4/1995 | Beyer et al. | |
| 6,177,708 B1 | 1/2001 | Kuang et al. | |
| 6,204,532 B1 | 3/2001 | Gambino et al. | |
| 6,300,657 B1 | 10/2001 | Bryant et al. | |
| 6,537,861 B1 | 3/2003 | Kroell et al. | |
| 6,624,475 B2 | 9/2003 | Bryant et al. | |
| 6,664,592 B2 | 12/2003 | Inumiya et al. | |
| 6,845,198 B2 | 1/2005 | Montgomery et al. | |
| 7,091,069 B2 | 8/2006 | Doris et al. | |
| 2003/0125925 A1* | 7/2003 | Walther et al. | 703/22 |
| 2004/0207019 A1* | 10/2004 | Bryant et al. | 257/350 |
| 2006/0001095 A1* | 1/2006 | Doris et al. | 257/348 |
| 2007/0152266 A1* | 7/2007 | Doyle et al. | 257/327 |
| 2007/0157140 A1* | 7/2007 | Holesovsky et al. | 716/5 |

OTHER PUBLICATIONS

Anderson, et al., U.S. Appl. No. 11/683,470, Amendment to Apr. 14, 2009 Office Action, filed Jun. 26, 2009.
U.S. Appl. No. 11/683,470, Office Action dated Apr. 14, 2009.
U.S. Appl. No. 11/683,470, filed Mar. 8, 2007, Notice of Allowance and Fees Due dated Sep. 17, 2009.

* cited by examiner

*Primary Examiner* — Sun J Lin
*Assistant Examiner* — Suresh Memula
(74) *Attorney, Agent, or Firm* — Richard Kotulak; Hoffman Warnick LLC

(57) ABSTRACT

A design structure including a transistor having a directly contacting gate and body is disclosed. In one embodiment, the transistor includes a gate; a body; and a dielectric layer extending over the body to insulate the gate from the body along an entire surface of the body except along a portion of at least a sidewall of the body, wherein the gate is in direct contact with the body at the portion.

20 Claims, 8 Drawing Sheets

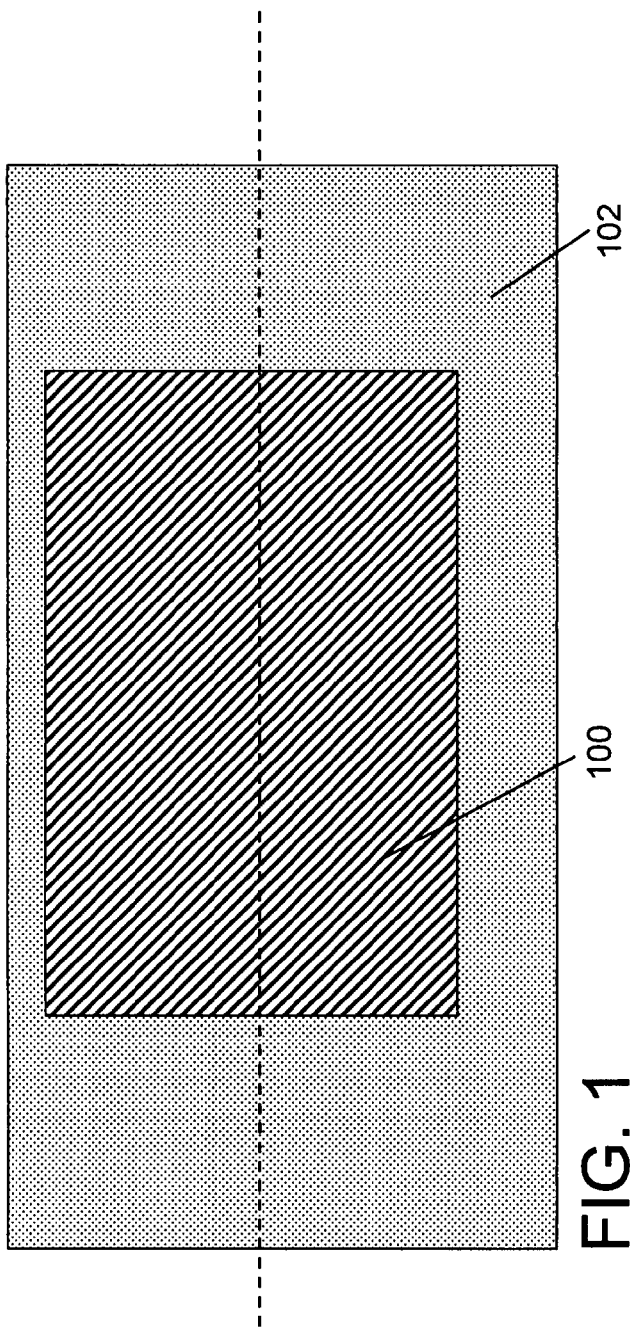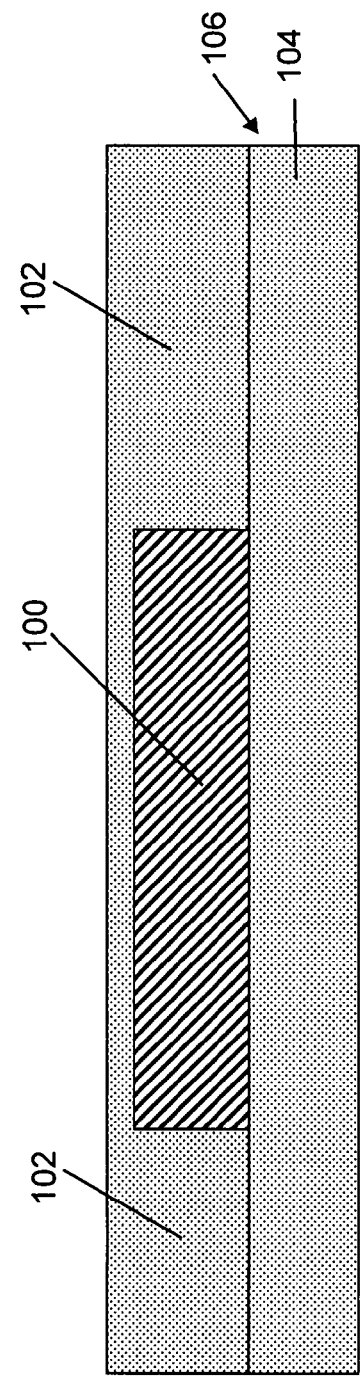

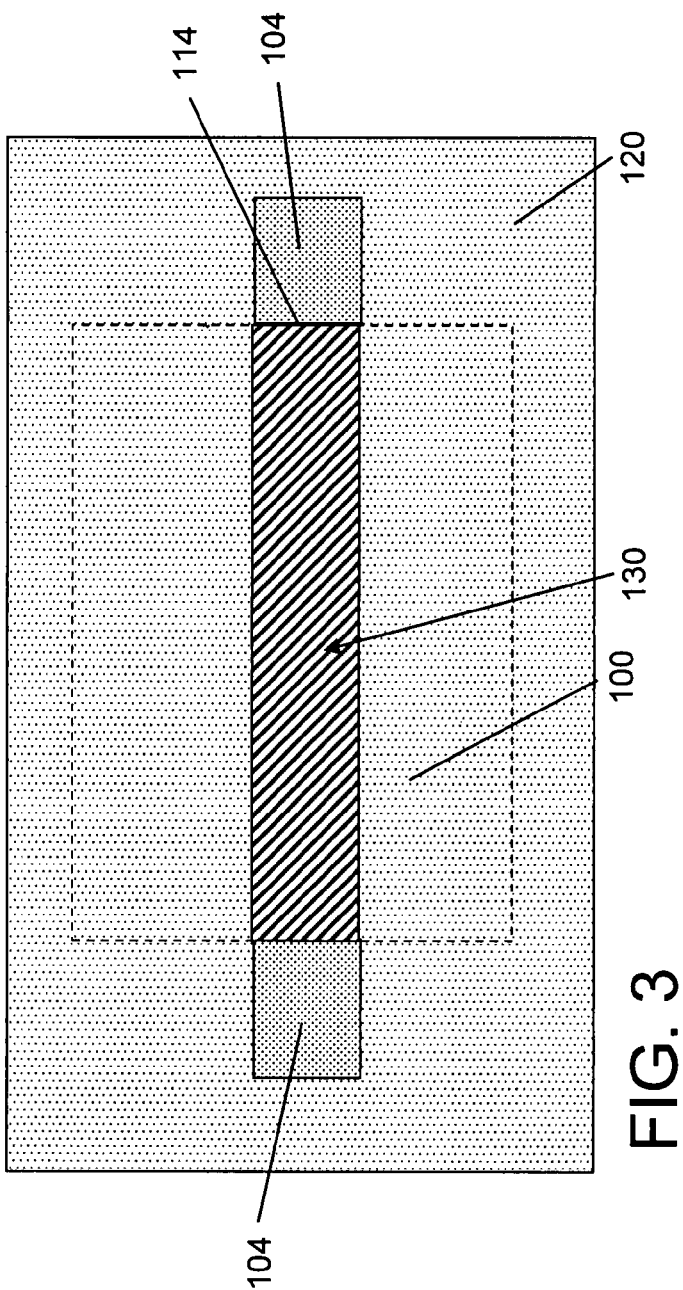
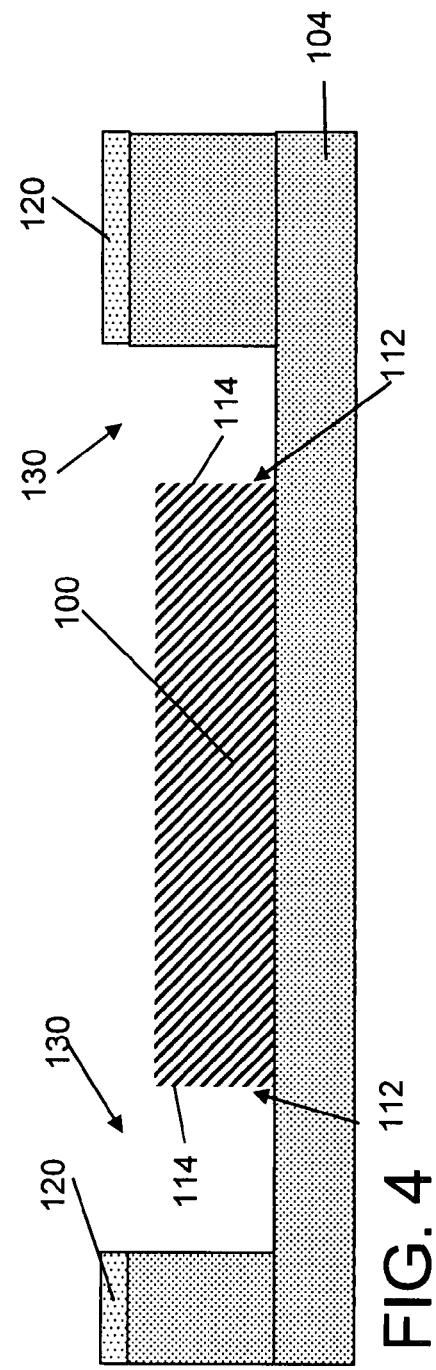
FIG. 3
FIG. 4

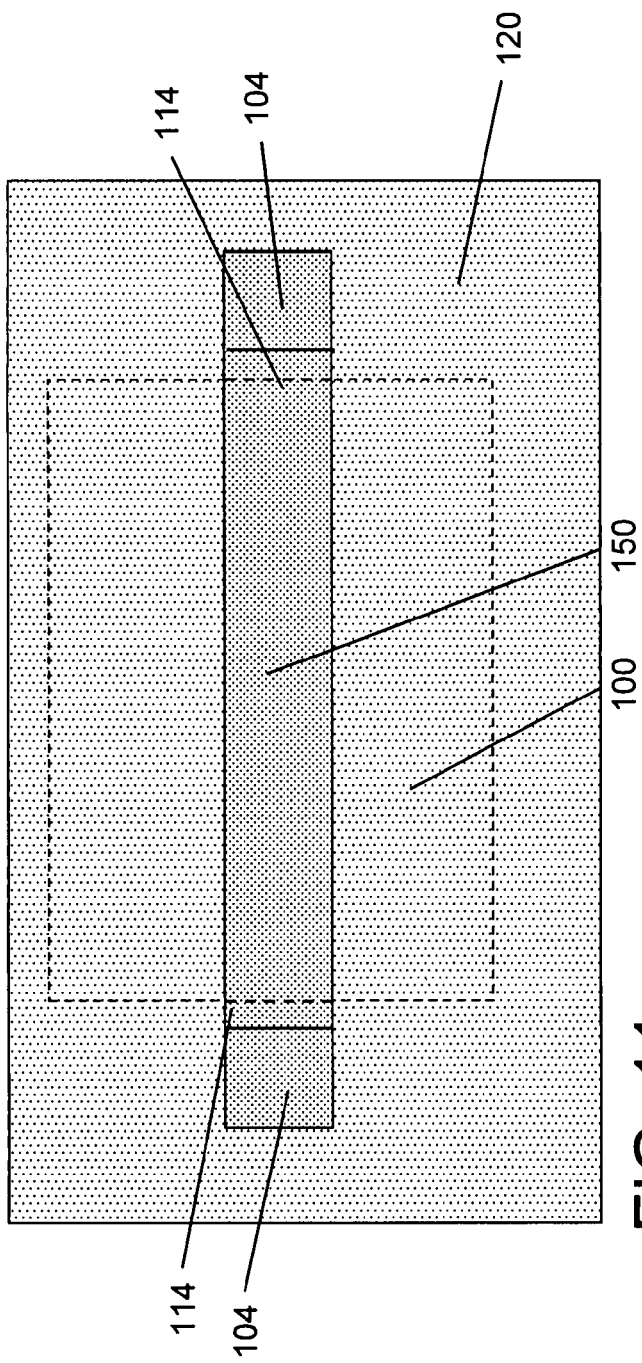
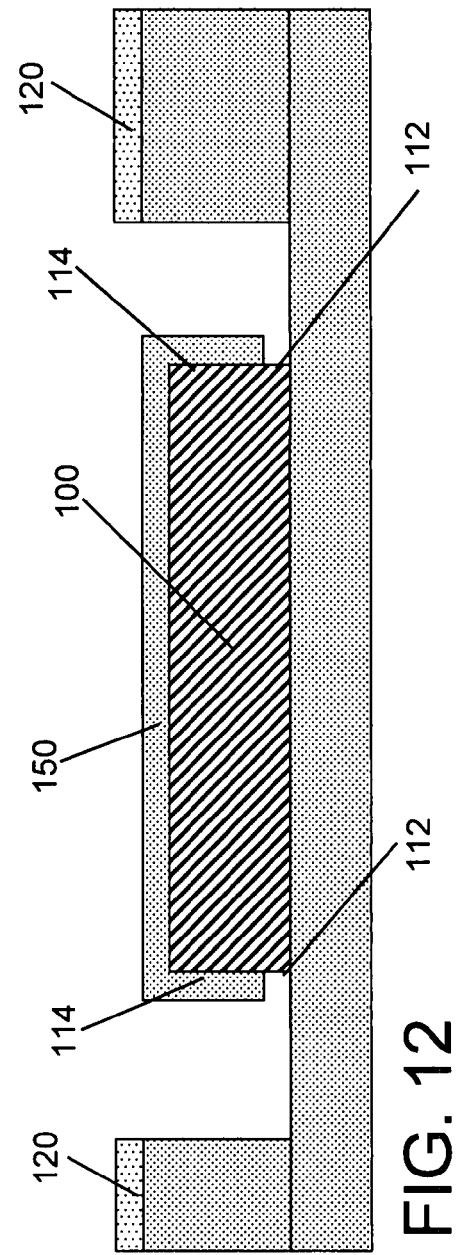
FIG. 11
FIG. 12

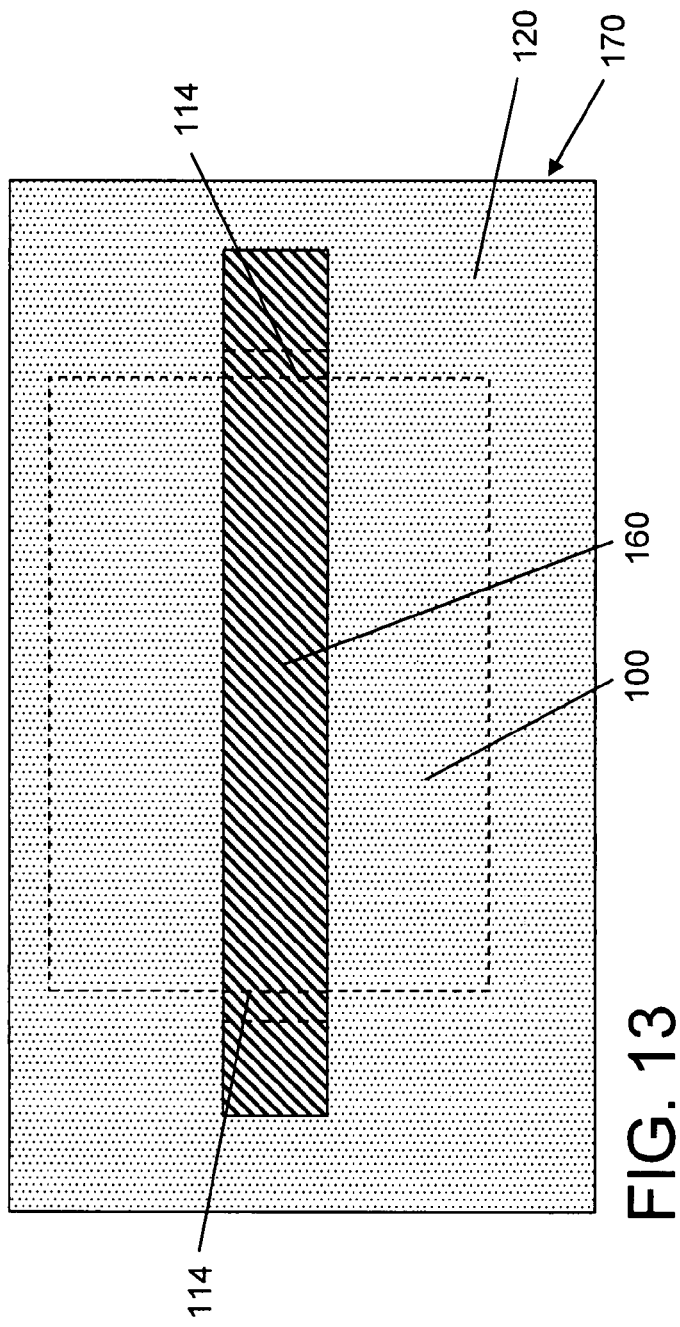
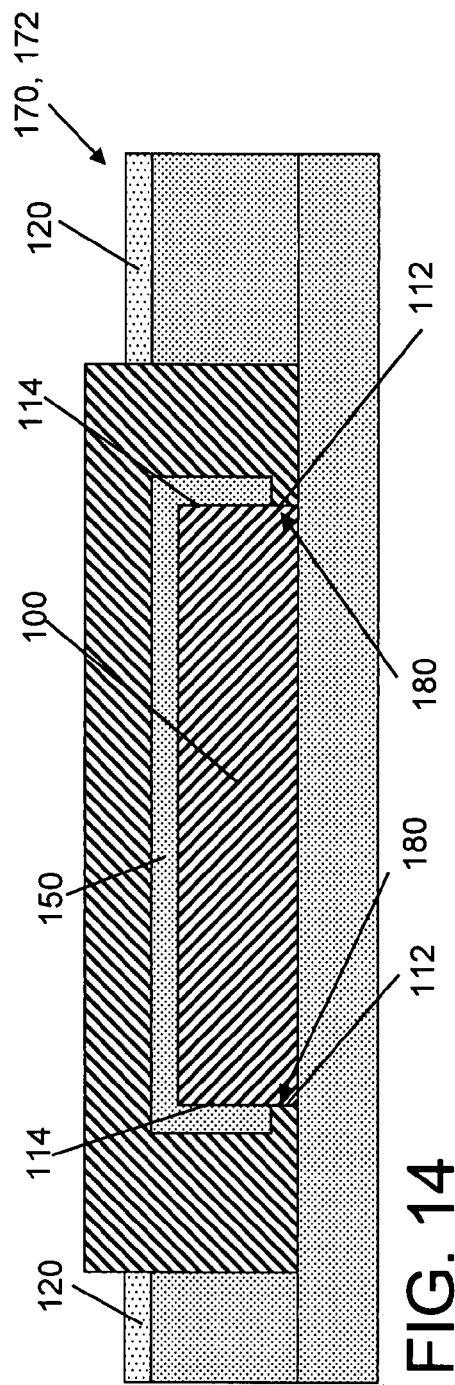
FIG. 13
FIG. 14

STRUCTURE INCLUDING TRANSISTOR HAVING GATE AND BODY IN DIRECT SELF-ALIGNED CONTACT

This application is related to U.S. Ser. No. 11/683,470, filed Mar. 8, 2007, currently pending.

BACKGROUND OF THE INVENTION

1. Technical Field

The invention relates generally to integrated circuit (IC) chip fabrication, and more particularly, to a design structure including a transistor having a directly contacting gate and body.

2. Background Art

In the integrated circuit (IC) chip fabrication industry there are a number of devices in which tying of the gate to the body is advantageous. One illustrative device in which this structure is advantageous is dynamic threshold complementary metal-oxide semiconductor (DTCMOS) devices. DTCMOS devices have the advantage of producing sub-threshold voltage slopes steeper than KT/q, where K is Boltzmann's constant, T is the temperature and q is the fundamental unit of charge. While the gate to body contacts are usually resistance-capacitance (RC) limited for super-threshold voltage applications, they are better suited for sub-threshold voltage circuits, which is due, in part, to their slower operating speed of sub-threshold voltage logic, and the ability to optimize RC for the low capacitance and high resistance situation. Unfortunately, typical contacts tying gates and bodies together require a variety of wiring and are non-self aligned. As a result, they are difficult to generate and take up more space on the circuit.

SUMMARY OF THE INVENTION

A transistor having a directly contacting gate and body and related methods are disclosed. In one embodiment, the transistor includes a gate; a body; and a dielectric layer extending over the body to insulate the gate from the body along an entire surface of the body except along a portion of at least a sidewall of the body, wherein the gate is in direct contact with the body at the portion. One method may include providing the body; forming a sacrificial layer that contacts at least a portion of a sidewall of the body; forming a dielectric layer about the body except at the at least a portion; removing the sacrificial layer; and forming the gate about the body such that the gate contacts the at least a portion of the sidewall of the body. In addition, A design structure including a transistor having a directly contacting gate and body is disclosed.

A first aspect of the invention provides a transistor comprising: a gate; a body; and a dielectric layer extending over the body to insulate the gate from the body along an entire surface of the body except along a portion of at least a sidewall of the body, wherein the gate is in direct contact with the body at the portion.

A second aspect of the invention provides a method of forming contact between a gate and a body thereof, the method comprising: providing the body; forming a sacrificial layer that contacts at least a portion of a sidewall of the body; forming a dielectric layer about the body except at the at least a portion; removing the sacrificial layer; and forming the gate about the body such that the gate contacts the at least a portion of the sidewall of the body.

A third aspect of the invention provides a method of forming contact to a body of a gate, the method comprising: providing the body; forming a sacrificial layer that contacts at least a portion of a sidewall of the body to block a sidewall body contact region; forming a dielectric layer about the body except at the at least a portion; removing the sacrificial layer; and forming a self-aligned gate contact to the body by forming the gate about the body such that the gate contacts the sidewall body contact region.

A fourth aspect of the disclosure includes a design structure embodied in a machine readable medium for designing, manufacturing, or testing a design, the design structure comprising: a transistor including: a gate; a body; and a dielectric layer extending over the body to insulate the gate from the body along an entire surface of the body except along a portion of at least a sidewall of the body, wherein the gate is in direct contact with the body at the portion.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 1-14 show one embodiment of a method of forming a contact between a gate and a body. In the figures, the odd number figures show top views of an associated even number figure, each of which show a cross-sectional view.

FIGS. 13 and 14 also show a transistor according to one embodiment.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Turning to the drawings, one embodiment of a method of forming contact between a gate and a body thereof is shown. In FIGS. 1 and 2, a body 100 is provided, i.e., an active area of a transistor. Body 100 is illustrated positioned between isolation regions 102 (e.g., shallow trench isolations (STI) of silicon oxide) atop a buried insulator layer 104 of a semiconductor-on-insulator (SOI) substrate 106 (substrate layer not shown). However, the teachings of the invention are not limited to this type substrate. Body 100 may be formed using any now known or later developed techniques, and may include any common body material such as silicon or doped silicon. Note, FIG. 1 shows body 100 as though it is on a surface of isolation regions 102. However, as shown in FIG. 2, body 100 may also be buried in dielectric or covered with a pad film for further processing.

Figure 5:
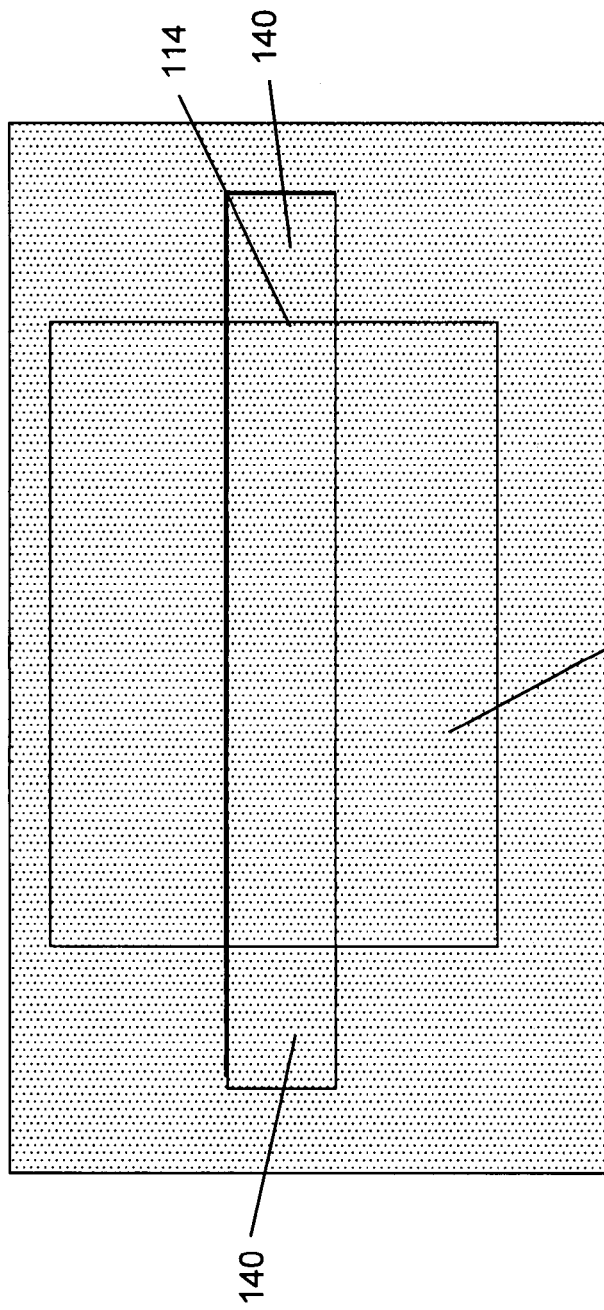
Figure 6:
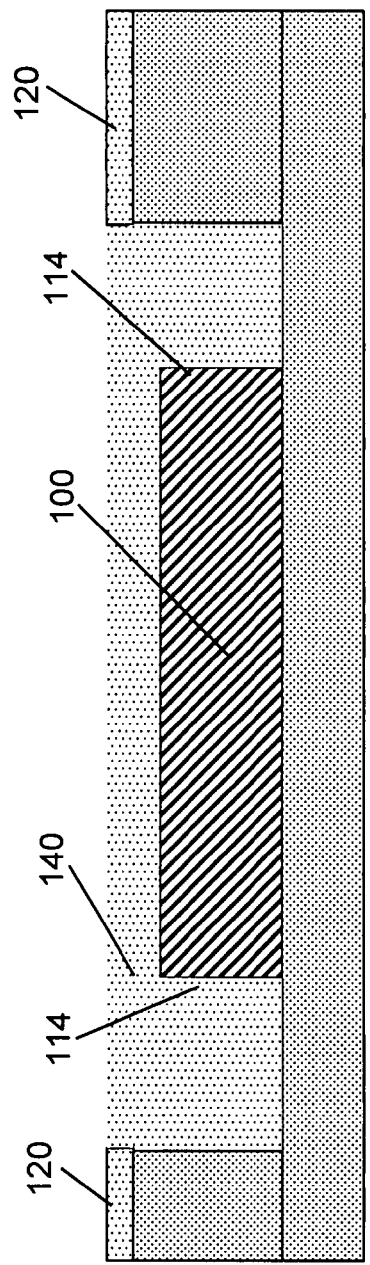
Figure 7:
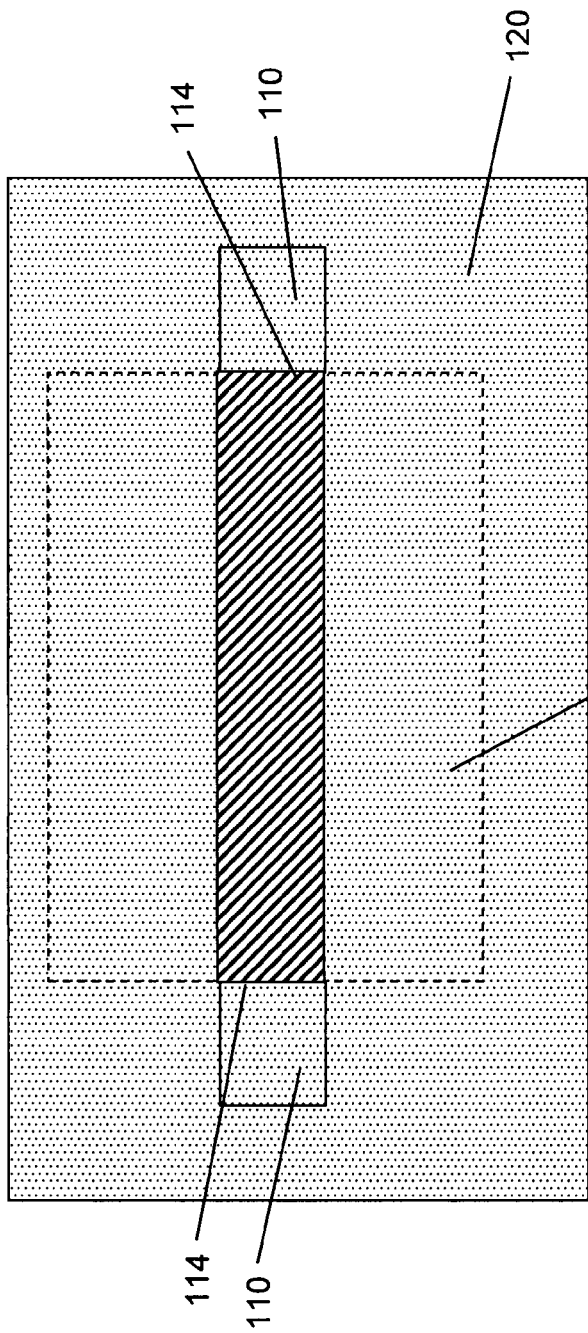
Figure 8:
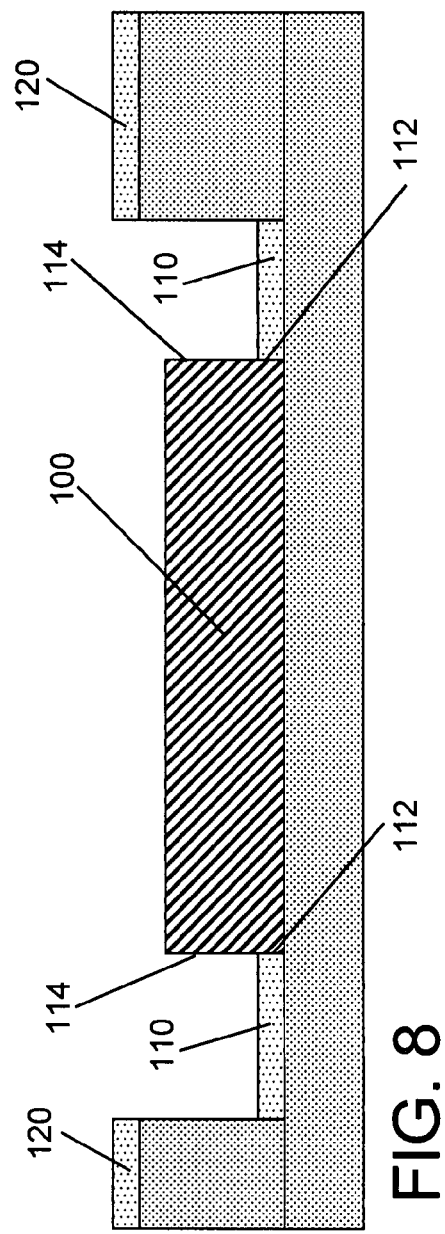

Next, as shown in FIGS. 3-8, a sacrificial layer 110 (FIGS. 7-8) that contacts at least a portion 112 (FIGS. 7-8) of a sidewall 114 (FIGS. 7-8) of body 100 is formed. In one embodiment, this step includes, as shown in FIGS. 3-4, forming a hardmask 120 over body 100. Hardmask 120 may include any now known or later developed hardmask material such as silicon oxide and silicon nitride. Next, as also shown in FIGS. 3-4, an opening 130 is formed to body 100 and along at least portion 112 of sidewall 114 using hardmask 120. Opening 130 may be formed by patterning an etching hardmask 120, and one or more etching steps to remove isolation regions 102 along sidewall 114. For example, a Damascene opening of hardmask 130 may be carried out to a surface of body 100, followed by an isolation region 102 etch, stopping on buried insulator layer 104. As shown in FIGS. 5-6, opening 130 is filled with a sacrificial layer material 140. Sacrificial layer material 140 may include, for example, silicon nitride. FIGS. 7-8 show recessing sacrificial layer material 140 adjacent to sidewall 114 of body 100, leaving only sacrificial layer 110 that contacts at least a portion 112 of sidewall 114.

Figure 9:
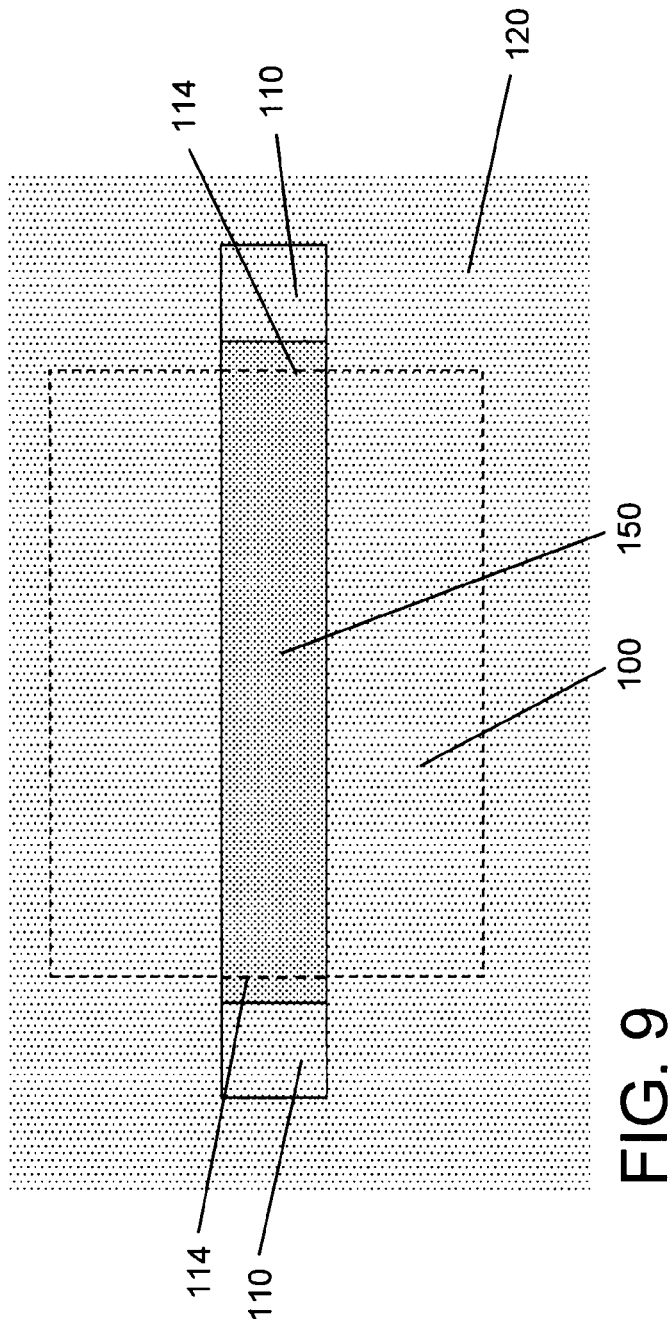
Figure 10:
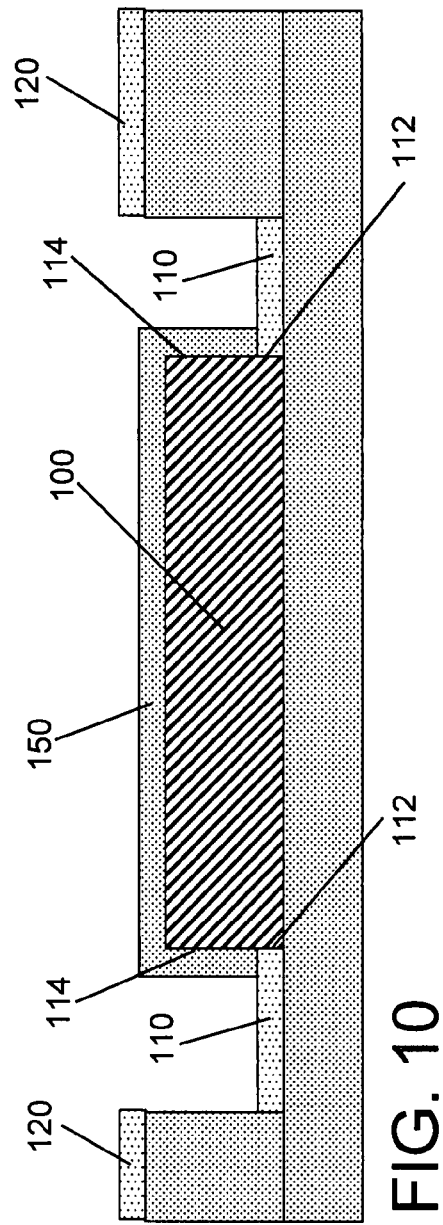

FIGS. 9-10 show forming a dielectric layer 150 about body 100 except at the at least a portion 112. Dielectric layer 150 may include, for example, silicon oxide, which may be epitaxial grown from body 100, or any other high dielectric constant material.

FIGS. 11-12 show removing sacrificial layer 110, e.g., by etching to buried insulator layer 104, thus exposing at least portion 112 of sidewall 114.

FIGS. 13-14 show forming a gate 160 about body 100 (and dielectric layer 150) such that gate 160 directly contacts at least portion 112 of sidewall 114 of body 100. In other words, a self-aligned gate contact 180 to body is formed by forming gate 160 about body 100 such that gate 160 contacts sidewall 114 body contact region, i.e., at least portion 112. Gate 160 may include a semiconductor material such as polysilicon (doped or undoped). In this fashion, field effect action is implemented where dielectric layer 150, acting as a gate dielectric exists, and direct contact action is implemented where gate 160 directly contacts body 100. This structure is useful for low voltage for DTCMOS devices. In particular, when gate 160 is turned on, it also turns on body 100 at the same time because of the direct contact, which lowers the threshold voltage of resulting transistor 170 (FIGS. 13-14) and makes transistor 170 turn on quickly.

As also shown in FIGS. 13-14, transistor 170 includes gate 160, body 100, and dielectric layer 150 extending over body 100 to insulate gate 160 from body 100 along an entire surface of body 100 except along portion 112 of at least a sidewall 114 of body 100. As described above, in one embodiment, transistor 170 may be a dynamic threshold complementary metal-oxide semiconductor (DTCMOS) device.

A complete IC 172, which may be referred to herein as a design structure, is created in a graphical computer programming language, and coded as a set of instructions on machine readable removable or hard media (e.g., residing on a graphical design system (GDS) storage medium). That is, design structure(s) is embodied in a machine readable medium used in a design process. (The design structure(s) may interface with any part of a machine readable media). The design structure(s) may include a netlist, which describes IC 172, and may include test data files, characterization data, verification data, or design specifications. If the designer does not fabricate chips or the photolithographic masks used to fabricate chips, the designer transmits the resulting design structure by physical means (e.g., by providing a copy of the storage medium storing the design) or electronically (e.g., through the Internet) to such entities as a foundry, directly or indirectly. The stored design is then converted into the appropriate format (e.g., graphic design system II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Figure 15:
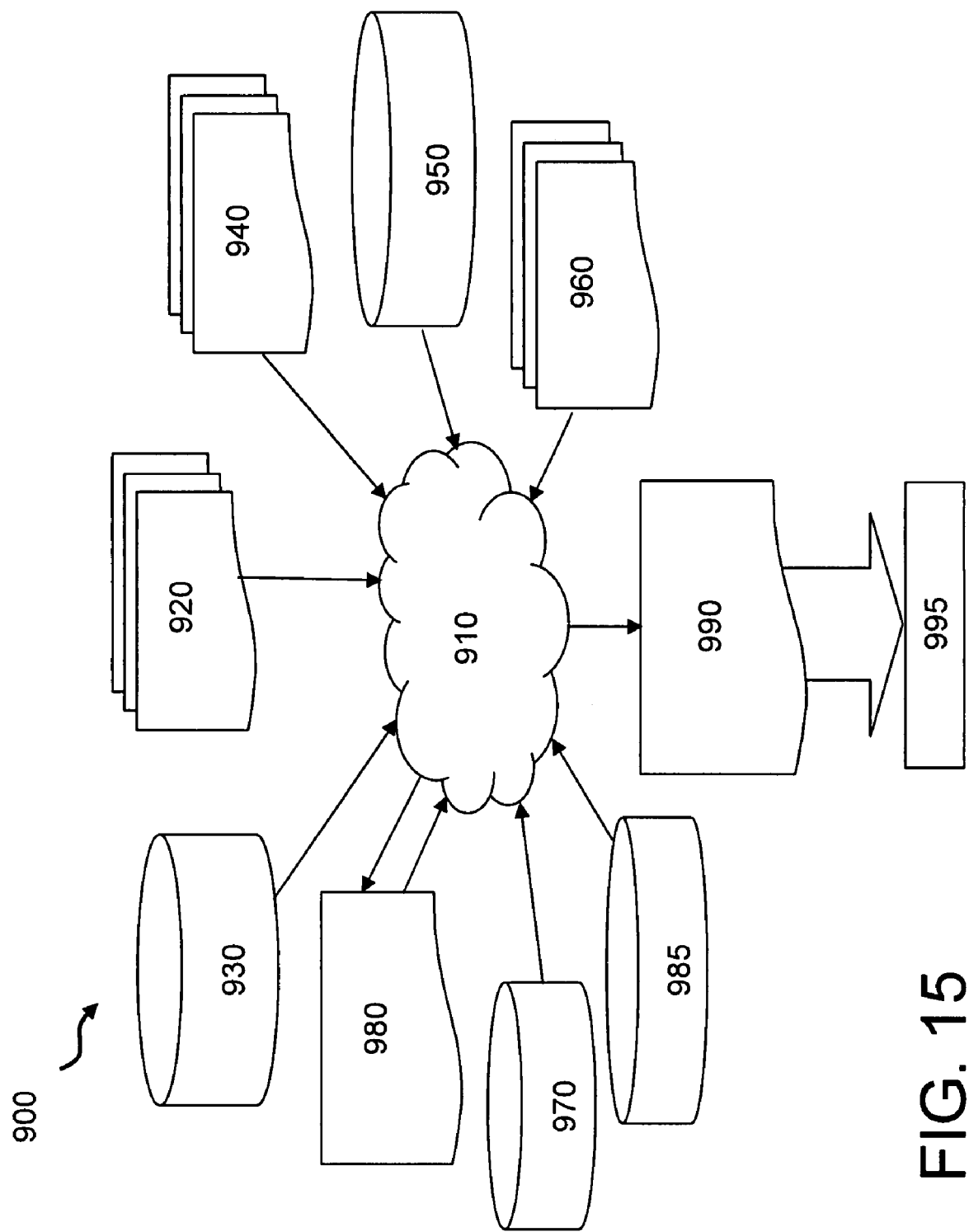
FIG. 15 shows a block diagram of an example design flow.

FIG. 15 shows a block diagram of an example design flow 900. Design flow 900 may vary depending on the type of IC 172 including transistor 170 being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises a transistor 170 (alone or as part of an IC 172) in the form of schematics or HDL, a hardware-description language (e.g., Verilog, VHDL, C, etc.). Design structure 920 may be contained on one or more machine readable medium. For example, design structure 920 may be a text file or a graphical representation of an IC 172 including transistor 170. Design process 910 preferably synthesizes (or translates) IC 172 including transistor 170 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the disclosure. The design structure of the disclosure is not limited to any specific design flow.

Design process 910 preferably translates an embodiment of the disclosure as shown in FIGS. 13 and 14, along with any additional integrated circuit design or data (if applicable), into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the disclosure as shown in FIGS. 13-14. Design structure 990 may then proceed to a stage 995 where, for example, design structure 990: proceeds to tape-out, is released to manufacturing, is released to a mask house, is sent to another design house, is sent back to the customer, etc.

The design structure, structures and methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A non-transitory computer readable medium storing code representative of a design structure realized upon execution of the code by a computer system, the code representative of the design structure including code representing a circuit, the code comprising:
   code representing:
      a transistor including
         a gate;
         a body underlying the gate and having a plurality of sidewalls; and
         a dielectric layer extending over and in direct contact with a length of an entire upper surface of the body and along a first portion of each of the plurality of sidewalls to insulate the gate from the body along the length of the entire upper surface of the body and the plurality of sidewalls except along a second portion of each of the plurality of sidewalls of the body,
         wherein the gate is in direct contact with the body only at the second portion of each of the plurality of sidewalls.

2. The non-transitory computer readable medium of claim 1, wherein the direct contact is self-aligned to the body.

3. The non-transitory computer readable medium of claim 1, wherein the design structure comprises a netlist, which describes the integrated circuit.

4. The non-transitory computer readable medium of claim 1, wherein the design structure resides on the computer readable medium as a data format used for exchange of layout data of integrated circuits.

5. The non-transitory computer readable medium of claim 1, wherein the design structure includes at least one of test data files, characterization data, verification data, or design specifications.

6. The non-transitory computer readable medium of claim 1, wherein the transistor further includes a buried insulator layer underlying both the gate and the body at the direct contact.

7. The non-transitory computer readable medium of claim 1, wherein the transistor is a dynamic threshold complementary metal-oxide semiconductor (DTCMOS) device.

8. A method comprising:
   encoding code representative of a design structure stored on a non-transitory computer readable medium of a source computer system into a set of data signals; and
   providing the set of data signals for use on a destination computer system distinct from the source computer system, the code representative of the design structure including code representing a circuit, the code comprising:
      code representing a transistor, the transistor including:
         a gate;
         a body underlying the gate and having a plurality of sidewalls; and
         a dielectric layer extending over and in direct contact with a length of an entire upper surface of the body and along a first portion of each of the plurality of sidewalls to insulate the gate from the body along the length of the entire upper surface of the body and the plurality of sidewalls except along a second portion of each of the plurality of sidewalls of the body,
         wherein the gate is in direct contact with the body only at the second portion of each of the plurality of sidewalls.

9. The method of claim 8, wherein the direct contact is self-aligned to the body.

10. The method of claim 8, wherein the design structure comprises a netlist, which describes the integrated circuit.

11. The method of claim 8, wherein the design structure resides on the computer readable medium as a data format used for exchange of layout data of integrated circuits.

12. The method of claim 8, wherein the design structure includes at least one of test data files, characterization data, verification data, or design specifications.

13. The method of claim 8, wherein the transistor further includes a buried insulator layer underlying both the gate and the body at the direct contact.

14. A computer system comprising:
   a source computer system including at least one computing device configured to transmit a design structure from the source computer system by performing a method comprising:
      encoding code representative of the design structure stored on a non-transitory computer readable medium of the source computer system into a set of data signals; and
      providing the set of data signals for use on a destination computer system distinct from the source computer system, the code representative of the design structure including code representing a circuit, the code comprising:
         code representing a transistor, the transistor including:
            a gate;
            a body underlying the gate and having a plurality of sidewalls; and
            a dielectric layer extending over and in direct contact with a length of an entire upper surface of the body and along a first portion of each of the plurality of sidewalls to insulate the gate from the body along the length of the entire upper surface of the body and the plurality of sidewalls except along a second portion of each of the plurality of sidewalls of the body,
            wherein the gate is in direct contact with the body only at the second portion of each of the plurality of sidewalls.

15. The system of claim 14, wherein the direct contact is self-aligned to the body.

16. The system of claim 14, wherein the design structure comprises a netlist, which describes the integrated circuit.

17. The system of claim 14, wherein the design structure resides on the computer readable medium as a data format used for exchange of layout data of integrated circuits.

18. The system of claim 14, wherein the design structure includes at least one of test data files, characterization data, verification data, or design specifications.

19. The system of claim 14, wherein the transistor further includes a buried insulator layer underlying both the gate and the body at the direct contact.

20. The system of claim 14, wherein the transistor is a dynamic threshold complementary metal-oxide semiconductor (DTCMOS) device.

* * * * *